United States Patent [19]

Nakamura et al.

[11] Patent Number: 5,116,479
[45] Date of Patent: May 26, 1992

[54] PROCESS FOR PRODUCING TRANSPARENT CONDUCTIVE FILM COMPRISING INDIUM OXIDE

[75] Inventors: Kyuzo Nakamura, Yachimata; Satoru Ishibashi, Narita; Yoshifumi Ota; Yasushi Higuchi, both of Yachimata, all of Japan

[73] Assignee: Nihon Shinku Gijutsu Kabushiki Kaisha, Kanagawa, Japan

[21] Appl. No.: 524,768

[22] Filed: May 17, 1990

Related U.S. Application Data

[62] Division of Ser. No. 415,742, Oct. 2, 1989, abandoned.

[30] Foreign Application Priority Data

Mar. 3, 1989 [JP] Japan .................................. 1-50086

[51] Int. Cl.⁵ .............................................. C23C 14/36
[52] U.S. Cl. ...................... 204/192.13; 204/192.29; 204/298.03
[58] Field of Search ............... 204/192.29, 298.03, 204/192.13

[56] References Cited

U.S. PATENT DOCUMENTS

| | | | |
|---|---|---|---|
| 4,428,809 | 1/1984 | Heimbach et al. | 204/192.29 |
| 4,500,408 | 2/1985 | Boys et al. | 204/298 |
| 4,500,409 | 2/1985 | Boys et al. | 204/298.03 |

FOREIGN PATENT DOCUMENTS 0115629 8/1984 European Pat. Off.

OTHER PUBLICATIONS

Brian Chapman, Glow Discharge Processes, John Wiley & Sons, New York, 1980, pp. 260-270.
Patent Abstracts of Japan, vol. 9, No. 112 (C-281)[1835], May 16, 1985; JP-A-60 5878 (Nippon Shinku Gijutsu K.K) Jan. 12, 1985.

*Primary Examiner*—John Niebling
*Assistant Examiner*—William T. Leader
*Attorney, Agent, or Firm*—Armstrong, Nikaido, Marmelstein, Kubovcik & Murray

[57] ABSTRACT

A process and apparatus for producing an In-O or In-Sn-O based transparent conductive film by a sputtering process is provided. The sputtering voltage is kept constant at 350V or less by maintaining the intensity of the magnetic field on the surface of the target at 400 Oe or greater. The apparatus contains a vacuum chamber wherein the substrate and target are mounted in opposite to each other. An electromagnet, used for adjusting the intensity of the magnetic field is located on the rear surface of the target. Additionally provided is a controller for the electric current supplied to the electromagnet. The controller is also connected to a DC power supply for the electromagnet.

2 Claims, 2 Drawing Sheets

PROCESS FOR PRODUCING TRANSPARENT CONDUCTIVE FILM COMPRISING INDIUM OXIDE

This is a division of application Ser. No. 415,742, filed Oct. 2, 1989, now abandoned.

BACKGROUND OF THE INVENTION

The present invention relates to a process and apparatus for producing an In-O or In-Sn-O based transparent conductive film (which will be hereinafter referred to as an ITO film) used for a display element for a liquid crystal display o the like.

PRIOR ART

There are conventionally known processes for producing such a transparent conductive film such as coating, vacuum deposition, and gas-phase reaction processes, as well as sputtering processes, including a DC or RF double-pole sputtering and a DC or RF magnetron sputtering. Among these producing processes, the sputtering processes are often used because they enable a transparent conductive film to be formed uniformly on a large-sized substrate.

It is known that the temperature of a substrate and the partial pressure of oxygen are factors affecting the electrical resistivity of a transparent conductive film produced by the sputtering process. It has been understood that the higher the substrate temperature, the lower the electrical resistivity of the resulting film. On the other hand, for the partial pressure of oxygen, it has been understood that in a region of lower oxygen partial pressure, the density of a carrier is larger, and the mobility is smaller because there are many vacancies of oxygen in such a region. Whereas in a region of higher oxygen partial pressure, the density of a carrier is smaller and the mobility is larger. Thus, there is an optimal partial pressure of oxygen that will result in an electrical resistivity of a minimum value from an even balance of the density and the mobility. Thus, it was a practice in the prior art sputtering process to form a transparent conductive film having a lower electrical resistivity wherein parameters of the substrate temperature and the partial pressure of oxygen gas were controlled.

In the prior art sputtering process, the reduction in the electrical resistivity of a transparent conductive film was limited when it is impossible to increase the temperature of a substrate. An example is the case of a full color STN system, wherein an ITO film is formed on a substrate of a color filter material having a heat-resistant temperature as low as 160 to 200° C.

Additionally, the prior art process also has the problem of nonconsistent electrical resistivity. This occurs when the sputtering is continuously carried out, resulting in an insulating oxide of In-O being produced on a surface of a target, thus discoloring the surface to black (such a discoloration will be referred to as blackening). With an increase of the blackening of the target, the electrical resistivity of a transparent conductive film formed on the substrate may be increased. Therefore, when a transparent conductive film is continuously formed on each of a plurality of substrates, for a long period of time, the electrical resistivity of the resulting film may be gradually increased. Thus, it was impossible to provide a transparent conductive film having a consistent electrical resistivity.

It is an object of the present invention to provide a process and apparatus for producing a transparent conductive film, wherein the above problems are overcome.

SUMMARY

The present inventors have made zealous studies to accomplish the above stated object and consequently have found that, in addition to the substrate temperature and the partial pressure of oxygen as factors affecting the electrical resistivity of a transparent conductive film formed on a substrate, the sputtering voltage greatly affects the electrical resistivity of a resulting transparent conductive film.

The present invention has been made on the basis of such knowledge and, according to the present invention, there is provided a process for producing an In-O or In-Sn-O based transparent conductive film by a sputtering process, wherein sputtering is effected at a sputtering voltage of 350V or less.

Reduction in the sputtering voltage is related to a reduction in the discharged impedance (target voltage/target current). For example, the discharged impedance is influenced by the intensity of a magnetic field on the surface of a target, i.e., if the magnetic field intensity is increased, the density of plasma is increased, resulting in a reduced sputtering voltage. In this case, sputtering may be carried out under conditions wherein the intensity of a magnetic field on the surface of a target is maintained at 400 Oe or more.

Additionally, if sputtering is continuously carried out for a long period of time, the surface of a target may be blackened and the sputtering voltage is accordingly increased. In this case, sputtering may be carried out under conditions wherein the intensity of the magnetic field may be adjusted to maintain a constant sputtering voltage during sputter formation of a film.

According to the present invention, targets for a transparent conductive film formed on a substrate include In, an In-Sn alloy, a sinter of In oxide, a sinter of In-Sn oxide, etc. Among them, the sinter of In-Sn oxide is preferred because its use in the formation of a transparent film on a substrate results in the film remaining in a stable state for a long period of time.

Sputtering gases include, for example, a mixed gas comprising an inert gas, such as argon gas, and an oxygen containing ga added thereto. When argon gas is used as an inert gas, the pressure of the mixed gas may be generally of the order of $10^{-3}$ Torr, and the partial pressure of the oxygen gas may be generally of the order of $10^{-5}$ Torr.

In the sequence for forming an In-O or In-Sn-O based transparent conductive film in a sputtering manner, an anion such a $O^-$, $O^{2-}$ or $InO^-$ is generated in the vicinity of the surface of a target. If the target voltage is, for example, $-400V$, these anions may be accelerated by an energy of 400 eV to smash into a substrate, thereby providing micro-damages to the transparent conductive film that is being formed. When a divalent ion such as $In^{2+}$ and $Sn^{2+}$ is generated by the micro-damages, which acts as an acceptor, the density of a carrier may be reduced. When the oxygen vacancies are collapsed, the density of a carrier may be also reduced. The reduction in density of a carrier will cause an increase in the electrical resistivity.

According to the present invention, sputtering is carried out at a sputtering voltage of 350V or less (equal to the target voltage), which suppresses to a lower level, the energy of an anion smashing into the substrate, thereby reducing the damage to a resulting transparent conductive film.

Additionally, according to the present invention, there is provided an apparatus for producing an In-O or In-Sn-O based transparent conductive film on a substrate, by a plasma dischargement generated between the substrate and a target, both for which are mounted in opposition to another within a vacuum chamber. An electromagnet, for adjusting the intensity of a magnetic field, is placed rear side on the surface of the target and a magnet controller, for controlling an electric current supplied to the electromagnet, in accordance with a change in sputtering voltage, is provided so as to be connected to a DC power source for the electromagnet.

DETAILED DESCRIPTION

The present invention will now be described by way of an embodiment with reference to the accompanying drawings.

Figure 1:
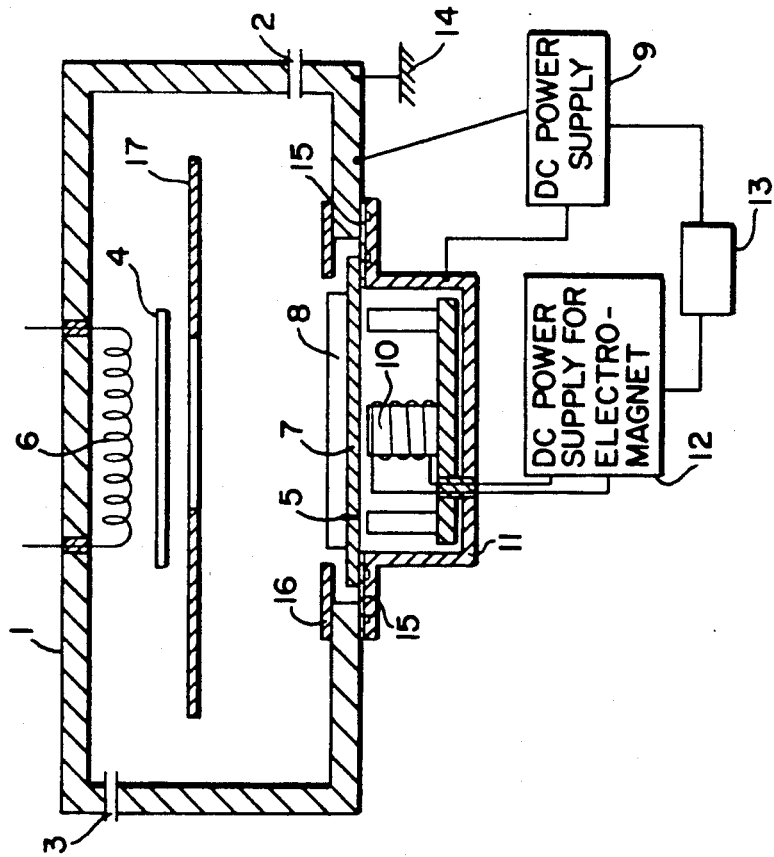
FIG. 1 is a sectional view of one embodiment of an apparatus for carrying out a process for producing a transparent conductive film according to the present invention.

FIG. 1 illustrates one embodiment of an apparatus for producing a transparent conductive film. In FIG. 1, the reference numeral 1 denotes a vacuum chamber that is designed so that the vacuum degree of the interior thereof is adjustable through an exhaust port 2, connected to suitable evacuating means such as an external vacuum pump, and so that a sputter gas,, for example, one consisting of a mixed gas of argon and oxygen, can be introduced into the vacuum chamber 1 through a gas inlet pipe 3 communicating with the vacuum chamber 1. In the vacuum chamber 1, a substrate 4 and a sputter cathode 5 are disposed in an opposed relation, and a heater 6 is mounted behind the substrate 4 for heating the latter.

A target 8, bonded by a brazing material, is disposed on a front surface of a backing plate 7 of the sputter cathode 5, and a cathode case 11, housing therein an electromagnet 10 connected to a plasma discharging DC power supply 9 having a voltmeter, is disposed behind the backing plate 7 of the sputter cathode. The vacuum chamber 1 and the cathode case 11 are connected through the plasma discharging DC power supply 9, so that when the vacuum chamber 1 is at earth potential, a negative voltage can be applied to the cathode case 11 to effect a DC magnetron sputtering within the vacuum chamber 1.

In the illustrated embodiment, a controller 13 is connected to the plasma discharging DC power supply 9 and a DC power supply 12 for the electromagnet. The controller 13 is capable of receiving variation signals corresponding to variations in sputtering voltage supplied from the plasma discharging DC power supply 9, and controlling a current to the DC power supply 12 for the electromagnet in accordance with the variation signal. This adjusts the magnetic field intensity generated on a surface of the target 8 within the range of 250 Oe to 1,600 Oe.

In FIG. 1, the reference numeral 14 is an earth connected to the vacuum chamber 1; the number 15 is an insulating sheet made of a Teflon plate disposed between the vacuum chamber 1 and the cathode case 11; the numeral 16 is an earth shield; and the numeral 17 is an anti-deposition plate.

It should be noted that while not shown, the target 8 is cooled by water cooling means mounted within the cathode case 11

Specified examples for forming a transparent conductive film will be described below.

EXAMPLE 1

Mounted within the vacuum chamber 1 in the producing apparatus described above and shown, were a substrate 4 made of a light transmittable glass (No. 7059 made by Corning Co. Corp., and having a size of 210 mm $\times$ 210 mm), and an oxide target 8 comprising $In_2O_3$ containing 10% by weight of $SnO_2$ incorporated therein (having a size of 125 mm $\times$ 406 mm). Then, the vacuum chamber 1 was evacuated by the evacuating means, through the exhaust port 2, to a degree of $8 \times 10^{-6}$ Torr. After which a sputtering gas consisting of argon and oxygen gases was introduced into the vacuum chamber 1 through the gas inlet pipe 3, so that the pressure of the interior of the vacuum chamber 1 was $5 \times 10^{-3}$ Torr. In this case, the partial pressure of the oxygen gas was $4 \times 10^{-5}$ Torr, and the distance between the substrate 4 and the target 8 was 80 mm.

Then, the DC magnetron sputtering was carried out, while the current supplied, from the DC power supply 12, to the electromagnet 10, by the controller 13, was controlled to vary the intensity of the magnetic field, at a central site between magnetic poles, generated on the surface of the target 8, i.e., magnetic field intensity of the magnetron field varied from 250 oe to 1,600 Oe. Further, the sputtering voltages were respectively determined at the following two stages of the sputtering: an initial stage of the sputtering (when the surface of the target material was not yet blackened, i.e., before the target blackened), and a stage after 40 hours of sputtering had lapsed (when the surface of the target material had been blackened, i.e., after the target blackened).

Figure 2:
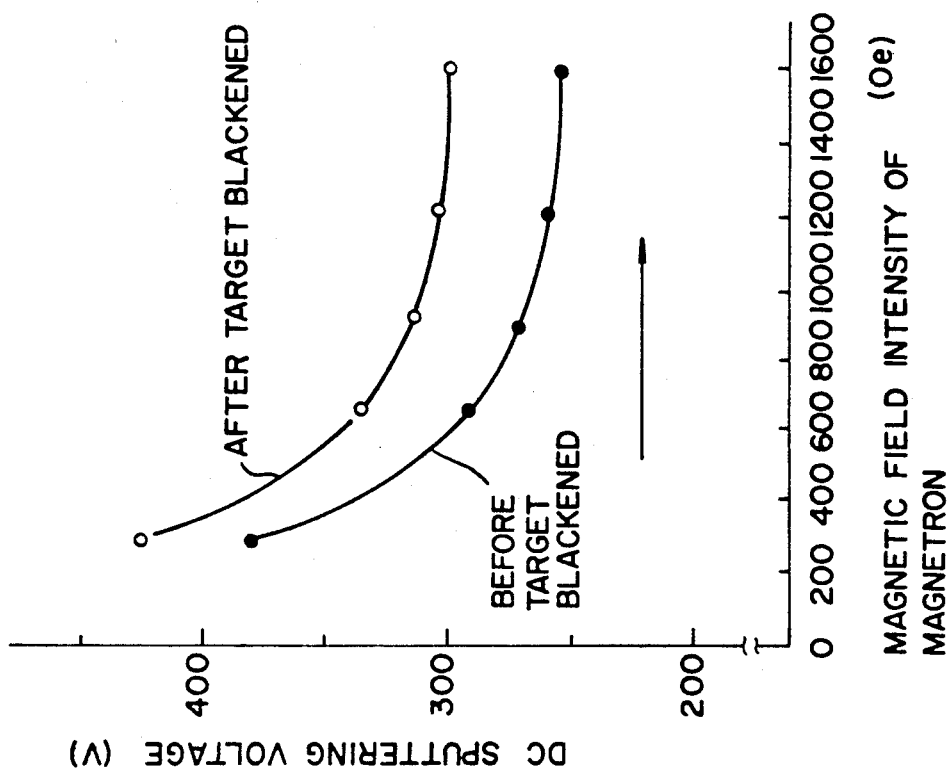
FIG. 2 is a characteristic graph illustrating the relationship between the magnetic field intensity of magnetron and the DC sputtering voltage.

In each of the stages, the sputtering voltage was measured for every magnetic field intensity (magnetic field intensity of magnetron), and the obtained results of measurement are shown in FIG. 2.

As apparent from FIG. 2, it was confirmed that in any of the initial sputtering stage and the stage after 40 hours of sputtering had lapsed, the sputtering voltage was reduced as the magnetic field intensity was increased. In any case, when the magnetic field intensity exceeded 900 Oe, the measured voltage of each of the obtained sputtering voltages showed a tendency not to further decrease.

Accordingly, it is possible to maintain the sputtering voltage constant by varying the intensity of the magnetic field on the surface of the target (in the direction of the arrow as shown in FIG. 2).

The sputtering was also carried out in an RF magnetron sputtering manner instead of the DC magnetron sputtering manner, and similar results were obtained.

EXAMPLE 2

Mounted within the vacuum chamber 1, in the producing apparatus described above and shown, were a substrate 4 made of a light transmittable glass (No. 7059 made by Corning Co. Corp., and having a size of 210 mm ×210 mm), and an oxide target 8 comprising $In_2O_3$ containing 10% by weight of $SnO_2$ incorporated therein (having a size of 125 mm ×406 mm). Then, the vacuum chamber 1 was evacuated by the evacuating means, through the exhaust port 2, to a degree of $8 \times 10^{-6}$ Torr. After which a sputtering gas consisting of argon and oxygen gases was introduced into the vacuum chamber 1 through the gas inlet pipe 3, so that the pressure of the interior of the vacuum chamber 1 was $5 \times 10^{-3}$ Torr. In this case, the distance between the substrate 4 and the target 8 was 80 mm.

Then, the temperature of the substrate 4 was set at room temperature (25° C.), 160° C. and 460° C., respectively, by heating the substrate with a heater 6. The DC magnetron sputtering was conducted at each of such temperatures, while varying the current supplied from the DC power supply 12, to the electromagnet 10, by way of the controller 13, to adjust the intensity of the magnetic field generated on the surface of the target 8, and while varying the sputtering voltage in accordance with the adjustment of the magnetic field intensity, resulting in the formation of an In-Sn-O based transparent conductive film having a thickness of 1,000 Å on the substrate 4.

In this case, the partial pressure of oxygen gas was adjusted so as to optimize the conditions of the substrate temperatures and the sputtering voltages.

The electrical resistivity of the transparent conductive film formed in the above process was measured for every sputtering voltage at every substrate temperature. The obtained results of measurement are shown in FIG. 3.

Figure 3:
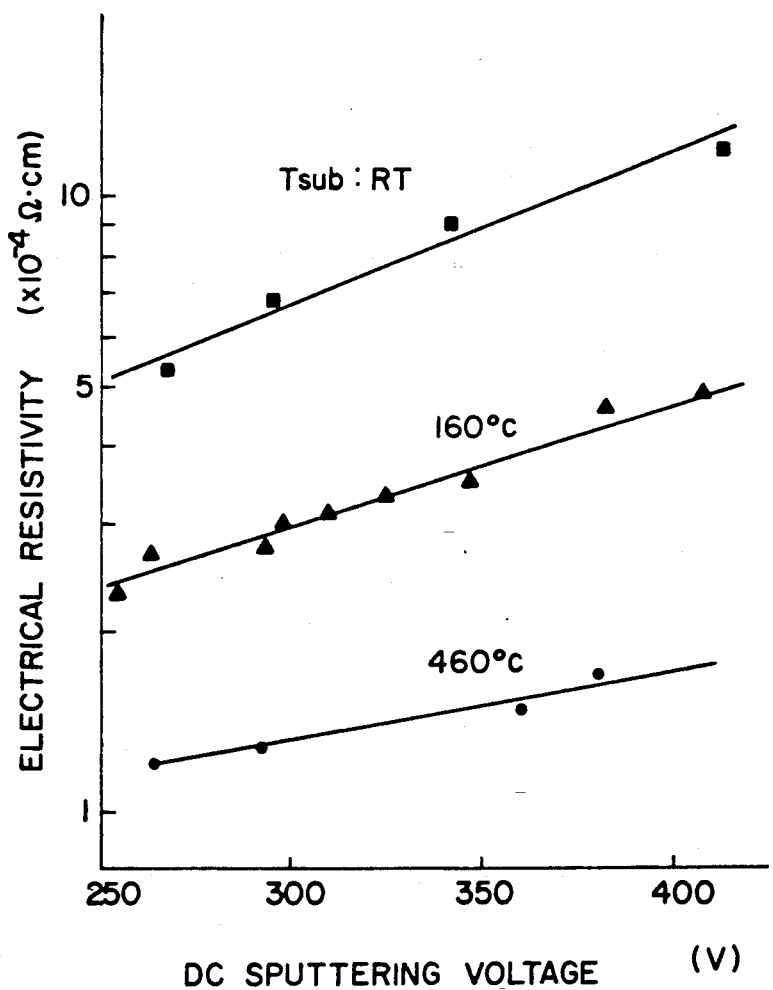
FIG. 3 is a characteristic graph illustrating a relationship between the DC sputtering voltage and the electrical resistivity under conditions of individual temperatures of a substrate.

As apparent from FIG. 3, it was confirmed that, at all the substrate temperatures, the electrical resistivity of the transparent conductive film could be reduced as the sputtering voltage was reduced.

Additionally, the sputtering was also carried out using as a target, an oxide material of a composition comprising $In_2O_3$ and $SnO_2$ incorporated therein in an amount other than 10% by weight, alternatively using an oxide material comprising $In_2O_3$ and 10% by weight of $SnO_2$ therein, as well as using In material alone or an In-Sn alloy as a target in place of the oxide material. Similar results were obtained in all of the above cases.

As previously discussed, in the above process for producing a transparent conductive film, sputtering is effected at a voltage 350V or less (equal to a target voltage). Therefore, there are the following effects: In sputtering the target to form a transparent conductive film on the substrate, the energy of an anion can be reduced, and the damage to the transparent conductive film can be also reduced so that a transparent conductive film, having a lower electrical resistivity, can be formed even on a substrate of a material having a lower heat-resistant temperature.

Additionally, when sputtering is carried out with the intensity of the magnetic field generated on the surface of a target being maintained at 400 Oe or more, a transparent conductive film having a lower electrical resistivity can be easily formed. This is because the sputtering voltage, during formation of the film, can be reduced only by adjustment of the intensity of magnetic field.

Further, even when sputtering is continuously carried out for a long period of time, it is possible to produce a transparent conductive film, having a consistently uniform electrical resistivity, by adjusting the intensity of the magnetic field to maintain the sputtering voltage constant during the formation of a film.

In the apparatus for producing a transparent conductive film according to the present invention, the electromagnet for adjusting the magnetic field intensity on the surface of the target is mounted on the back side of the target, and the controller for controlling the current to the electromagnet, in accordance with variation in sputtering voltage, is connected to a DC power supply for said electromagnet. Therefore, it is possible to maintain a lower sputtering voltage constant, thus leading to the effect that a transparent conductive film, having a lower electrical resistivity, can be easily produced.

What is claimed is:

1. In a sputtering process for producing an In-O or In-Sn-O based transparent conductive film on a substrate, said process comprising sputtering a target comprising In, or In and Sn, by applying a sputtering voltage to the target while introducing a sputtering gas comprising oxygen to generate a plasma discharge between the substrate and the target, said target having a magnetic field on its surface, the improvement which comprises maintaining the sputtering voltage at 350V or less by increasing the intensity of the magnetic field on the surface of the target as the conductive film is being formed.

2. A process according to claim 1, wherein the sputtering voltage is maintained constant.

* * * * *